Aug. 28, 1962 A. ROTHBART 3,051,916

ELECTROMECHANICAL DELAY DEVICE

Filed Feb. 4, 1959

Inventor
ARTHUR ROTHBART
By
Thomas J. Kilgannon Jr.
Agent 3,051,916
Patented Aug. 28, 1962

3,051,916

ELECTROMECHANICAL DELAY DEVICE

Arthur Rothbart, Bronx, N.Y., assignor to International Telephone and Telegraph Corporation, Nutley, N.J., a corporation of Maryland Filed Feb. 4, 1959, Ser. No. 791,228
6 Claims. (Cl. 333—30)

This invention relates to electromechanical delay devices and more particularly to torsional magnetostrictive delay lines.

In recent years, electromechanical delay devices have come into wide use principally because relatively large delays are obtainable from relatively small lengths of delay line as compared with electrical delay lines. While the conventional longitudinal magnetostrictive delay lines have provided longer delays as compared with electrical delay lines, they have a poor pulse dispersion factor especially when coiled.

One method of obtaining greater delays and less pulse dispersion is to utilize a delay device which propagates a pulse in the torsional mode. A delay device which operates in the torsional mode transmits a pulse which travels at a velocity of propagation which is 1.6 times slower than a pulse which is propagated in what is known as a longitudinal mode. One such scheme which produces a torsional pulse which is known in the prior art uses mutually perpendicular longitudinal and circular applied magnetic fields coupled to a magnetostrictive element. In this prior art, the longitudinal field is supplied by a conventional solenoid-type transducer, while the circular field is provided by passing a D.C. current thru the magnetostrictive element. If an alternating pulsed field is applied to the solenoid which supplies the longitudinal field, a torsional pulse will be transmitted along the element. This torsional pulse, however, is accompanied by a longitudinal pulse. The presence of this longitudinal pulse which travels faster than the torsional pulse, however, makes such a delay line inoperable for most purposes. If the undesired longitudinal pulse were eliminated and the delay line operated in a solely torsional mode and without utilizing intermediate mode transformers as other prior art schemes do, a delay line which provides a delay 1.6 times as long as prior art delay lines and which has negligible pulse dispersion would result.

It is, therefore, an object of this invention to provide a delay line system which is an improvement over prior art delay line systems.

Another object is to provide a delay line device which operates in the torsional mode alone.

Still another object is to provide a magnetostrictive delay line device in which it is possible to generate a mechanical torsional pulse directly from an electrical signal, that is, without the use of intermediate mechanical mode transformers.

Yet another object of this invention is to provide a magnetostrictive delay line device which provides a greater delay per unit length and less pulse dispersion than prior art devices.

A feature of this invention is the utilization of an element torsionally responsive to mutually perpendicular applied fields; one of the fields being directed longitudinally of said element, the other of said fields being directed circularly of said element. In accordance with this feature, means are coupled to the element for applying a steady longitudinal field, while the circularly directed field is pulsed to propagate a mechanical torsional moment along the element.

Another feature of this invention is the combination of a magnetostrictive delay element with a toroidally wound magnetostrictive transducer to provide a field transverse to the length of and circularly about said magnetostrictive element.

The above mentioned and other objects and features of this invention will become more apparent by reference to the following description of embodiments thereof taken in conjunction with the accompanying drawings in which.

Figures 1, 2, 3:
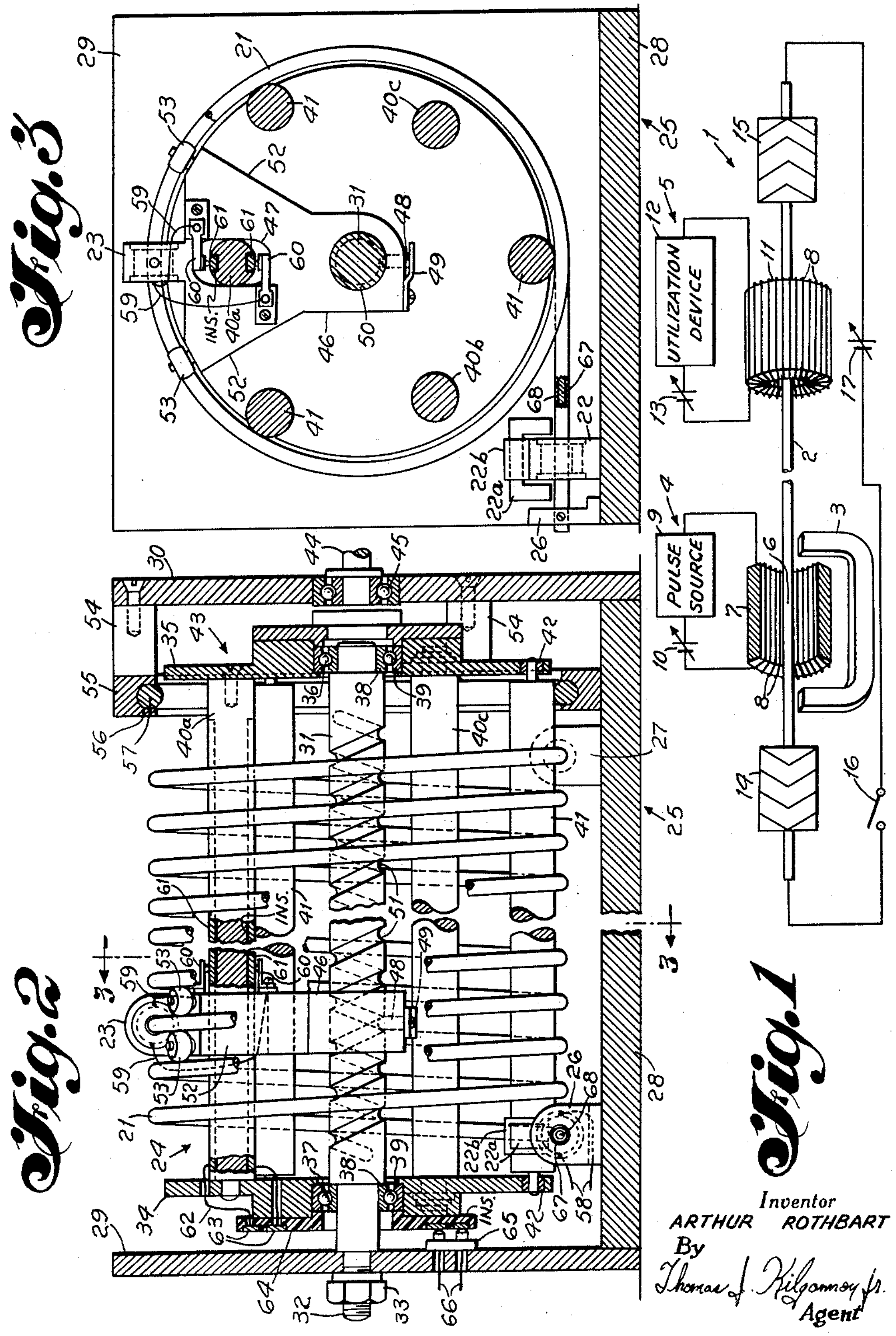
FIG. 1 is a longitudinal partial cross-sectional drawing of a magnetostrictive delay line which operates solely in a torsional mode.
FIG. 2 is a longitudinal partial cross-sectional drawing of an adjustable magnetostrictive helical delay line.
FIG. 3 is a cross-sectional view taken along lines 3—3 of FIG. 2.

Referring to FIG. 1, there is shown therein a torsional electromechanical delay device 1 comprising an element 2, torsionally responsive to mutually perpendicular applied magnetic fields. One of these magnetic fields is directed longitudinally of element 2 and the other of these fields is directed transverse to and circularly about element 2. Permanent magnet 3 is shown coupled to element 2 for applying a steady longitudinal magnetic field. Also coupled to element 2 is a means 4 for applying a pulsed circularly directed field to propagate a mechanical torsional moment along element 2. Means 5, remote from means 4, responsive to a mechanical torsional moment is shown coupled to element 2 to convert a mechanical torsional moment into an electrical signal.

In FIG. 1, element 2 which is torsionally responsive to mutually perpendicular applied magnetic fields is an elongated element made of a magnetostrictive material, such as nickel. Permanent magnet 3, coupled to element 2 for applying a steady longitudinal field to element 2, is maintained in closely spaced relationship to element 2 such that permanent magnet 3 and a portion 6 of element 2 form a closed magnetic circuit. From this, it may be seen that the flux lines in portion 6 of element 2 are substantially parallel to the longitudinal axis of element 2. Means 4 coupled to element 2 for applying a pulsed circularly directed magnetic field includes a toroidally wound coil 7 which surrounds element 2 or is coaxial of element 2 at portion 6. Toroidally wound coil 7, therefor, applies a magnetic field which encircles or surrounds element 2 at portion 6 and is perpendicular to the steady longitudinal magnetic field in portion 6. The turns 8 of toroidal coil 7 should be substantially parallel to the longitudinal axis of element 2 and every effort should be made to minimize skew in winding toroidal coil 7. The minimizing or elimination of skew is important as it is this step which eliminates any longitudinal component of magnetic field from appearing in pulsed form. If there is no pulsed longitudinal component of magnetic field, a mechanical longitudinal pulse cannot be propagated in element 2 and the only field which is varied is the circularly directed magnetic field which, in conjunction with the steady longitudinal magnetic field, produces a pulse which propagates solely in the torsional mode. Any pulsed longitudinal component which appears due to imperfections in the toroidal winding is, in any event, negligible and is, for all practical purposes, not present. The field produced by toroidal coil 7 has a doughnut like configuration and should be applied in such a way that it is closely coupled to magnetostrictive element 2 such that the leakage flux of the circular magnetic field created by the toroid will pass into element 2 at portion 6. This field is similar to the type of field which can be obtained by passing a D.C. current through a wire. The outer surface of toroidal coil 7 may be shielded as this portion supplies a field which is not coupled to magnetostrictive element 2. Means 4 for applying a pulsed circularly directed field further includes a pulsed source of electrical energy 9 and a biasing means 10 such as a battery serially connected with the turn of toroidally wound coil 7. Means 5 responsive to a mechanical torsional moment coupled to magnetostrictive element 2 to convert a mechanical torsional moment into an electrical signal includes a toroidally wound coil 11 which is similar in every respect to toroidally wound coil 7 and further includes a utilization device 12 and a biasing means 13, such as a battery, serially connected with the turns 8 of toroidally wound coil 11.

In FIG. 1 terminations 14 and 15 are shown disposed coaxially of magnetostrictive element 2 and adjacent the extremities of element 2. These terminations are utilized to prevent unwanted signals from being reflected to either the input toroidal coil 7 or output toroidal coil 19 and are of a type well known to those skilled in the art.

When a longitudinal and a circular magnetic field are simultaneously applied to a rod or wire of some magnetostrictive material, such as nickel, the resultant lines of forces form helices around the axis of the wire. This resultant magnetic field causes the wire or rod to be twisted or placed in a state of torsional stress. This phenomenon is called the "Wiedemann effect."

If now, either the originally applied longitudinal or circular magnetic fields are changed incrementally by a pulsing technique, a torsional mechanical pulse will be generated. This pulse will propagate down the wire at an approximate velocity of 0.12 inch per microsecond. If, however, the longitudinal magnetic field is pulsed, as has been shown in the prior art, a longitudinal pulse will be generated in addition to a desired torsional pulse. In instances where the desirable qualities of a torsional pulse, i.e. 1.6 times lower velocity than a longitudinal pulse and less pulse dispersion, could be utilized, the presence of the longitudinal pulse usually makes such a device impractical further up to the time of the teaching of this invention no technique has been developed which permits the operation of magnetostrictive delay lines in a torsional mode without the utilization of mechanical mode transformers. However, by utilizing the technique in accordance with the principles of this invention it is possible to generate a torsional pulse without the accompanying prior art longitudinal mode pulse and further, it is possible to generate a torsional pulse directly from an electrical signal without the utilization of intermediate mechanical mode transformers.

In accordance with the principles of this invention, therefore, the operation of the electromechanical delay device 1 of FIG. 1 is as follows: A steady longitudinal magnetic field is applied to portion 6 of magnetostrictive element 2 by means of permanent magnet 3 which is disposed in close coupled relationship with magnetostrictive element 2. The magnetic field directed circularly of element 2 is supplied by toroidally wound input coil 7, the turns of which are substantially parallel to and disposed coaxially of portion 6 of magnetostrictive element 2. Biasing means 10 is adjusted to optimize the amplitude of the pulse coupled to magnetostrictive element 2. By utilizing a toroidally wound coil, it is possible to apply a circularly directed field to only a portion of magnetostrictive element 2 thereby permitting a mechanical torsional moment to be induced at portion 6 of magnetostrictive element 2. The torsional pulse, thus generated directly from an electrical signal propagates along magnetostrictive element 2 at a velocity which is 1.6 times less than a pulse which is propagated in the longitudinal mode. When the mechanical torsional pulse arrives at the toroidally wound output transducer 11, this mechanical torsional moment is converted directly into an electrical signal provided a magnetic field has been generated by applying a current from biasing means 13 through the turns 8 of toroidally wound output transducer 11. As is well known, the mechanical pulse upon reaching output transducer 11 disturbs the generated magnetic field because the permeability of the magnetostrictive element 2 is changed as the mechanical torsional pulse physically changes the structure of element 2. In this way, a rate of change of flux is encountered by the turns of the toroidally wound transducer 11 and a current is set up therein which is delivered to utilization device 12.

In FIG. 1 an alternative method of providing a biasing magnetic field is shown where it is not desired to incorporate biasing sources 10 and 13 in series with the toroidally wound transducers 7 and 11. By closing switch 16 a biasing source 17, in the form of a battery, may be connected across the extremities of magnetostrictive element 2 and by this means a circularly directed biasing field is applied which may be varied to optimize the amplitude of the torsional pulse and to provide a field which must be varied by the mechanical torsional pulse to provide an electrical output.

It should be noted that the output toroidally wound transducer 11 utilizes only a circularly applied magnetic field in order to detect the torsional pulse.

A torsional mechanical pulse can be detected by either a longitudinal or toroidal receiver coil. However, the longitudinal type coil will also detect a longitudinal mechanical pulse whereas, the toroidal coil will detect only the torsional mechanical pulse thereby further eliminating any possibility of detecting any undesired longitudinal pulses which may have been generated at the time the torsional pulse was generated. Further, the embodiment of FIG. 1 is not to be construed as a limitation on the structure of this device. Element 2, for instance may be coiled into the form of a helix and input and output means 4 and 5 respectively, may be coupled to said element in the fashion of co-pending application S.N. 753,493, filed August 6, 1958 entitled Adjustable Delay Line in the names of M. A. Argentieri and F. A. Lind. A consideration of FIGS. 2 and 3 will indicate how the teaching according to the principles of this invention may be applied to the aforementioned co-pending application.

In FIGS. 2 and 3, a helical magnetostrictive delay line 21 for transmission of a signal therealong is shown. Toroidal magnetostrictive transducers 22 and 23 are shown coupled about portions of helical magneostrictive delay line 21 and are utilized to apply a torsional signal to and to receive a torsional signal from delay line 21 respectively. Further, means 24 are shown which simultaneously apply a linear component of motion to one of transducers 22 and 23 such that the length of helical delay line 21 is adjusted between transducers 22 and 23 thereby determining the amount of delay applied to a signal placed on delay line 21.

The toroidal transducers 22 and 23, as in the embodiment, of FIG. 1, provide a circular magnetic field to only the portions of helical magnetostrictive delay line 21 which are disposed coaxially of these transducers. The longitudinal magnetic field required for the generation of a mechanical torsional pulse at input transducer 22, in FIGS. 2 and 3, is provided by a permanent magnet *22a* disposed in close coupled relationship to a portion of helical delay line 21.

Helical delay line 21 may be fabricated in a number of ways to minimize deformation and sag during operation. In one method, the magnetostrictive material which may consist of flexible thin-wall nickel tubing, a single wire or a number of fine wires, is encased in a thermoplastic tube which is then molded into the required helical form by heating at a proper temperature. In another method helical line 21 may be formed by encasing the magnetostrictive material in a plastic tube such as Teflon. The plastic encased magnetostrictive material is then placed in a metal tube, such as copper, and cold worked into the required helical form. The metal tube is then slit longitudinally along the direction of pulse propagation to eliminate eddy currents which would shield the delay line material from the magnetic field of the transducer coil.

Helical delay line 21 is disposed coaxial of a given axis and is held in fixed position relative to housing member 25 by termination 26, 27 which are fixed to the horizontal member 28 of housing member 25. Housing member 25 which may be fabricated from some metal such as aluminum has, in addition, end portions 29, 30 between which helical delay line 21 is mounted. Included in the means 24 to affect a given relative motion between the helical delay line 21 and one of the toroidal transducers 22, 23 is a threaded metal shaft 31 disposed coaxially of the given axis. Threaded shaft 31, preferably mde of brass, is fixedly attached to end portion 29 by means of a threaded extension 32 of shaft 31 which passes through end portion 29 and is fixed thereto by nut and lock washer assembly 33. Further included in means 24 are metallic end-frame members 34, 35 which are carried by ball bearings 36, 37 and are disposed adjacent the ends of threaded shaft 31. End-frame members 34, 35 may be made of some light weight metal such as aluminum. The inner races 38 of ball bearings 36, 37 are, for the purposes of this invention, connected to shaft 31 and there is no relative motion between shaft 31 and inner race 38. The outer races 39, however, have mounted thereon end-frame members 34, 35 so that end frame members 34, 35 are rotatable about fixed threaded shaft 31. Spacer rods **40*a*, 40*b*, 40*c*, used to maintain the radial and axial position of end-frame members 34, 35 fixed with respect to each other, are disposed 120° apart and parallel to the given axis. The spacer rods 40*a*, 40*b*, 40*c*, are made of metal such as stainless steel and are rigidly held to the end frame members 34, 35 by any means well known to those skilled in the art. Helix support rods 41 are also included in means 24 and are shown in FIGS. 2, 3 rotatably connected to end frame members 34, 35 by means of low friction bearings 42, such as Oilite bearings which are mounted in end frame members 34, 35. The helix support rods 41 are made of a metal such as aluminum and are shown disposed 120° apart, parallel to the given axis and in engaging relation with the turns of the helical delay line 21 on the inner surface of the helical delay line 21. The end frame members 34, 35, the spacer rods 40*a*, 40*b*, 40*c*, and the helix support rods 41, therefore, comprise a cage-like structure which is rotatable about fixed threaded shaft 31 and within fixed helical line 21. For purposes of simplification, the combination of end frame members 34, 35, spacer rods 40*a*, 40*b*, 40*c*, and helix support rods 41 will hereinafter be referred to as cage 43. A shaft 44, carried by a ball bearing 45 which is mounted in end portion 30, is rotatably connected to end frame member 35 such that the rotation of shaft 44 rotates cage 43 about threaded shaft 31 and within helical delay line 21**.

In FIGS. 2 and 3, toroidally wound magnetostrictive input transducer 22 and permanent magnet **22*b* are shown fixedly mounted to horizontal housing member 28 and coupled to helical delay line 21 which is terminated by termination 26 after passing through transducer 22. The permanent magnet, 22*a* which supplies the steady longitudinal component of magnetic field to helical delay line 21, is shown mounted on toroidally wound magnetostrictive input transducer 22 by means of a clamping member 22*b* which is affixed to toroidal input transducer 22. Output transducer 23, also toroidally wound, is shown coupled to delay line 21 and connected to a support member 46 which is threadably receivable on threaded shaft 31. Transducer support member 46 contains an aperture 50 through which threaded shaft 31 passes. The interior of aperture 50 may be threaded to mate with the threads on shaft 31 but a simple arrangement comprising a key 48 and a bracket 49 is shown fixedly mounted to transducer support member 46 to cause transducer 23 to advance in a linear direction as transducer support member 46 is rotated. Transducer support member 46 contains another aperture 47, through which spacer rod 40*a* passes in tight fitting relationship with the straight sides of aperture 47. Thus, as cage 43 is rotated, spacer rod 40*a* follows this rotation due to its fixed position between end-frame members 34, 35; and transducer support member 46, because support rod 40 passes through aperture 50, is caused to rotate. Thus, a rotary component of motion is applied to transducer 23 by rotation of cage 43 and a linear component of motion is applied simultaneously to transducer 23 by the action of the threads 51 of threaded shaft 31 bearing against key 48. The pitch of the threads 51 is selected relative to the pitch of the helix 21 such that for one complete revolution of the cage 43, the transducer 23 travels a linear distance which is equal to the pitch of helix 21**.

Transducer support member 46 contains flared portions 52 integral with the transducer support member 46 which are used to support and position a plurality of trolleys 53. The trolleys 53 which are rotatably mounted on the flared portions 52 of member 46 are used to guide the turns of helical delay line 21 through transducer 23 in such a way that a clearance is maintained between the transducer 23 and the helix 21. Distortion of the helix 21 due to transducer 23 bearing against the turns of the helix 21 is thereby prevented.

End portion 30 has a plurality of extensions 54 associated therewith, which, at the extremity of their extension, support an annular ring 55 having a groove 56 disposed in the inner surface thereof. Groove 56 contains an O ring 57 made of rubber or some other material which provides for frictional contact engagement of the helix support rods 41 so that upon rotation of cage 43 helix support rods 41 rotate on their own axes. By this means, sliding engagement between the turns of the helix 21 and the support rods 41 is minimized and at the same time the helix is supported and maintained in its original shape.

In FIG. 2 toroidal input transducer 22 is energized by placing a pulsed electrical signal on input leads 58. In the arrangement of FIG. 2, the longitudinal and circular magnetic fields are applied exactly as described in connection with the embodiment shown in FIG. 1. Also, a biasing means 10 and a pulse source 9, as shown in FIG. 1, may be coupled to input leads 58 and the biasing arrangement 13 and utilization device 12 may be coupled to output leads 66. In lieu of this biasing arrangement, a D.C. current from a battery 17, such as shown in FIG. 1 may be utilized without difficulty, because the helix 21 is stationary and an insulating covering 68 on helix 21 permits a current to be passed therethrough with no danger of shock whatsoever. Input and output transducers, 22 and 23, respectively may be interchanged without adversely affecting the operation of this device. By magnetostrictive action, the electrical signal is converted in the magnetostrictive helical delay line 21 to a mechanical torsional impulse which travels along the helical line 21 at a known sonic rate. A given amount of delay may then be introduced by rotating shaft 44 which adjusts the length of the delay line between transducers 22 and 23. The output transducer 23 which has been adjusted to apply a given delay to the signal reconverts the mechanical torsional impulse to an electrical signal in the same manner as described in connection with the output transducer 11 of FIG. 1. Output leads 59 apply the electrical signal through sliding contacts 60 to two insulated conductive strips 61 which are inlaid on the surface of spacer rod **40*a*. From thence, the signal is carried by leads 62 to insulated annular slip rings 63 which are inlaid in a ball-bearing retainer member 64. Contacts 65 then pick-off the signal from slip rings 63 and apply it to output terminals 66 which are mounted on end portion 29. The transducer 22 with permanent magnet 22*a* may be interchanged with transducer 23** without affecting the operation of this device.

It should be noted, at this point, that proper operation of the device disclosed herein is not only dependent upon the cooperation of all the elements involved but also, as far as the transmission of the signal from input transducer 22 to output transducer 23 along helical delay line 21 is concerned, is dependent upon the proper fabrication of helical delay line 21 as described previously. Care must be taken to insure that the magnetostrictive portion 67 of helical delay line 21 is mechanically isolated from helix support rods 41 to prevent unwanted damping of the signal as the signal passes along helical delay line 21. This signal damping is prevented by placing a covering of plastic material 68, such as Teflon, previously mentioned as an insulator for a D.C. bias placed on helix 21, about the turns of the helix. In addition, the use of low-friction material, such as Teflon, provides for ease of movement as cage 43 is rotated internally of helical delay line 21.

Because helical delay line 21 is supported mechanically by helix support rods 41 and because toroidal output transducer 23 is guided about the turns of helical delay line 21 by trolleys 53, a ruggedized adjustable delay line is provided which is not subject to warping and which is better able to withstand shock and vibration. Further, because the helical line 21 is properly supported and kept substantially free from warping, it is possible to obtain improved resolution and resetability. These excellent mechanical qualities, the longer delay per unit length, the improved pulse dispersion characteristics and the generation of a torsional mode alone directly from an electrical signal without utilizing intermediate mechanical mode transformers coupled with means for providing a continuously variable delay, provide a unit which is superior in operation to any known prior art device.

While we have described above the principles of our invention in connection with specific apparatus it is to be clearly understood that this description is made only by way of example and not as a limitation to the scope of our invention as set forth in the objects thereof and in the accompanying claims.

I claim:

1. An adjustable delay line comprising a helical magnetostrictive delay line for transmitting a torsional signal therealong, a toroidal transducer coupled about a portion of said helical delay line to apply said signal in the form of a pulsed circularly directed magnetic field, thereto, a permanent magnet cooperatively coupled with said toroidal transducer to said portion to apply a steady magnetic field longitudinally of said portion and perpendicularly of said circularly directed magnetic field, another toroidal transducer coupled about another portion of said helical delay line to receive said signal therefrom and means for simultaneously applying a linear component of motion and a rotary component of motion to said one of said transducers such that the length of said helical delay line is adjusted between said transducers thereby determining the amount of delay applied to said signal.

2. A torsional electromechanical delay device comprising a magnetostrictive element torsionally responsive to mutually perpendicular applied magnetic fields, one of said fields being directed longitudinally of said element, the other of said fields being directed circularly of said element, means coupled to said element for applying a steady longitudinal magnetic field, first toroidal means coupled to said element for applying a pulsed circularly directed magnetic field to propagate a mechanical torsional moment therealong solely in the torsional mode, the axis of said toroidal means coinciding with the axis of said magnetostrictive element whereby the leakage flux produced by said toroidal means induces said circularly directed magnetic field in said magnetostrictive element, second toroidal means coupled to said magnetostrictive element and responsive to only torsional disturbances propagated along said element, the axis of said second toroidal means coinciding with a portion of the axis of said magnetostrictive element whereby torsional disturbances induced in said element by magnetostrictive action propagate along said element and are detected by said second toroidal means, said second toroidal means being insensitive to longitudinally induced disturbances in said element.

3. A torsional electromechanical delay device comprising a magnetostrictive element torsionally responsive to mutually perpendicular applied magnetic fields, one of said fields being directed longitudinally of said element, the other of said fields being directed circularly of said element, means coupled to said element for applying a steady longitudinal magnetic field, first toroidal means coupled to said element for applying a pulsed circularly directed magnetic field to propagate a mechanical torsional moment therealong solely in the torsional mode, said first toroidal means including a torus surrounding said magnetostrictive element and disposed parallel thereto, a coil wound upon said torus and having a plurality of turns each of said turns having a portion disposed coaxially of and in substantially parallel relationship with a portion of said magnetostrictive element whereby the leakage flux produced by said turns induces said circularly directed magnetic field in said magnetostrictive element, second toroidal means coupled to said magnetostrictive element and responsive to only torsional disturbances propagated along said element, said second toroidal means including a torus surrounding said magnetostrictive element and disposed parallel thereto, a coil wound on said torus, said coil having a plurality of turns, each of said turns having a portion disposed coaxially of and in substantially parallel relationship with a portion of said magnetostrictive element whereby torsional disturbances induced in said element by magnetostrictive action propagate along said element and are detected by said second toroidal means, said second toroidal means being insensitive to longitudinally induced disturbances in said element.

4. A torsional electromechanical delay device comprising an elongated magnetostrictive element in the form of a helix, first means for generating a steady longitudinal magnetic field coupled to said element, second means utilizing leakage flux for generating a first steady circular magnetic field coupled to said element, third means applied to said second means for generating a second pulsed circular magnetic field to propagate a mechanical disturbance along said element solely in the torsional mode, fourth means coupled to said element and responsive to only the torsional mode of said torsional mechanical disturbance to convert said torsional mechanical disturbance into an electrical signal, said second means and said fourth means each including a torus surrounding said element and disposed coaxially with said element and a coil having a plurality of turns wound on each said torus, each of said turns being coaxially disposed and in substantially parallel relationship with a portion of said element whereby said second means generates solely a circular magnetic field in said element and said fourth means is responsive to only a torsional disturbance in said element.

5. An adjustable torsional delay line comprising a housing member having two end portions, a helical magnetostrictive delay line fixedly mounted between said end portions coaxially of a given axis for transmitting a torsional signal therealong, a first toroidal transducer utilizing leakage flux coupled about a portion of said helical delay line to apply a torsional signal thereto, a second toroidal transducer utilizing leakage flux coupled about another portion of said helical delay line to receive said torsional signal therefrom, the axis of each of said transducers coinciding with the axis of a portion of said delay line, a threaded shaft disposed coaxially of said given axis and supported by said end portions, a member threadably receivable on said shaft and supporting said second transducer such that for one complete rotation of said member said second transducer travels a linear distance equal to the pitch of said helical delay line, a cage revolvably mounted on said end portions coaxially of said given axis, rotary members carried by said cage member disposed parallel to said given axis and each said rotary member being in contacting relationship with all the turns of said helically shaped delay line and means to rotate said rotary members when said cage is rotated to minimize sliding engagement between said rotary members and said turns, said rotary members serving to support and maintain the shape of said helical delay line.

6. A torsional electromechanical delay device comprising an elongated magnetostrictive element, first means for generating a steady longitudinal magnetic field coupled to said element, second means utilizing leakage flux for generating a first steady circular magnetic field coupled to said elongated element, means applied to said second means for generating a second pulsed circular magnetic field to propagate a mechanical torsional moment along said element and third means utilizing leakage flux coupled to said element and responsive to said mechanical torsional moment to convert said mechanical torsional moment into an electrical signal, said second means and said third means each including a torus disposed about said element and coaxial of said element, and a coil having a plurality of turns, wound on each said torus, each of said turns being coaxial and substantially parallel to a portion of said element whereby said second means induces solely a torsional disturbance in said element and whereby said third means is responsive to only a torsional disturbance in said element.

References Cited in the file of this patent

UNITED STATES PATENTS

| | | |
|---|---|---|
| 2,667,621 | Burns et al. | Jan. 26, 1954 |
| 2,696,590 | Roberts | Dec. 7, 1954 |
| 2,736,824 | Roberts | Feb. 28, 1956 |
| 2,846,654 | Epstein et al. | Aug. 5, 1958 |
| 2,876,419 | Gianola et al. | Mar. 3, 1959 |
| 2,895,113 | Agar | July 14, 1959 |

FOREIGN PATENTS

| | | |
|---|---|---|
| 758,647 | Great Britain | Oct. 10, 1956 |